United States Patent [19]
Setty et al.

[11] Patent Number: 6,091,300
[45] Date of Patent: Jul. 18, 2000

[54] METHOD AND APPARATUS FOR ADJUSTING THE INPUT COMMON MODE VOLTAGE OF A DIFFERENTIAL AMPLIFIER

[75] Inventors: Palaksha Setty, Sunnyville, Calif.; Krishnaswamy Nagaraj, Somerville, N.J.

[73] Assignee: Lucent Technologies, Inc., Murray Hill, N.J.

[21] Appl. No.: 08/954,705

[22] Filed: Oct. 20, 1997

[51] Int. Cl.[7] .............................. H03F 3/45; H03F 1/02; H03F 3/04
[52] U.S. Cl. ................................ 330/258; 330/9; 330/297
[58] Field of Search .................................. 330/258, 261, 330/253, 254, 127, 297, 9

[56] References Cited

U.S. PATENT DOCUMENTS

| | | | |
|---|---|---|---|
| 4,105,942 | 8/1978 | Henry | 330/261 |
| 5,047,727 | 9/1991 | Theus | 330/9 |
| 5,124,663 | 6/1992 | McEntarfer et al. | 330/9 |
| 5,805,019 | 9/1998 | Shin | 330/9 |

*Primary Examiner*—Robert Pascal
*Assistant Examiner*—Patricia T. Nguyen
*Attorney, Agent, or Firm*—Synnestvedt & Lechner LLP

[57] ABSTRACT

A method and apparatus for adjusting the output common-mode of a differential amplifier is disclosed. This is accomplished by reducing the supply voltage to the differential amplifier during the auto-zero mode and returning the supply voltage to the original level during the amplification mode.

16 Claims, 3 Drawing Sheets

METHOD AND APPARATUS FOR ADJUSTING THE INPUT COMMON MODE VOLTAGE OF A DIFFERENTIAL AMPLIFIER

BACKGROUND OF THE INVENTION

The present invention relates to a differential amplifier in which the input common-mode is adjustable.

Differential amplifiers are fundamental building blocks in analog integrated circuit design. The input common-mode voltage of a differential amplifier, defined as the average of the two input signals applied to the differential amplifier, is an important design specification. In DC coupled differential amplifiers, the input common-mode is set by the positive and negative signals applied to the differential amplifier. However, there are a wide variety of analog MOS sample data circuits in which the input signals are capacitively coupled and the input common-mode is set by a separate common-mode circuit.

A commonly used circuit for a differential amplifier 10 is shown in FIG. 1. In differential amplifier 10, input transistors M1 and M2, in combination with tail current source $I_{REF}$, form an input differential pair. Devices M3 and M4 form cascoding devices which reduce the input capacitance at the gates of input transistors M1 and M2 in a well-known manner. Diode connected transistors M5 and M6 form a differential load and also set the output common-mode for the differential amplifier 10. The output common-mode voltage for differential amplifier 10 is set at $V_{DD}-|V_{GS}|$, where $V_{DD}$ is the power supply voltage and $|V_{GS}|$ is the absolute value of the gate to source voltage of nominally identical devices M5 and M6.

Ideally, a zero differential input to a differential amplifier should produce a zero differential output. However, due to inherent device mismatches, to obtain a zero differential output a non-zero input signal needs to be applied to the inputs. This non-zero input signal is referred to as the input referred offset-voltage of the differential amplifier. In applications where this offset voltage is not tolerable, the offset voltage can be stored on input capacitors C1 and C2 as shown in FIG. 2. Referring to FIG. 2, before differential amplifier 10 begins amplification, switches S1 and S2 are closed and the inputs $V_{IP}$ and $V_{IM}$ are set at their common-mode voltage $V_{CM}$. Nodes V1 and V2 charge to a common-mode voltage set by the output of differential amplifier 10. In an offset-free differential amplifier, the voltages at nodes V1 and V2 are substantially equal to the output common-mode voltage of the differential amplifier. However, in the presence of the amplifier offset, the difference between the voltages on nodes V1 and V2 is substantially equal to the amplifier offset. This mode, where the offset and input common-mode of the amplifier and the reference common mode of the input signal are acquired and/or set, is commonly referred to as the "auto-zero" or "offset acquisition" mode.

Once the switches S1 and S2 are opened, differential amplifier 10 is in the amplification mode. In this mode, the offset voltage (which is stored on capacitors C1 and C2) is added to the inputs before they are presented to differential amplifier 10. The result is offset-free amplification. However, because of the capacitive coupling, the input common-mode of differential amplifier 10 is established by differential amplifier 10 itself.

For the differential amplifier circuitry shown in FIGS. 1 and 2, the output common-mode voltage is given by $V_{DD}-|V_{GS}|$, where $|V_{GS}|$ is the absolute value of the gate-to-source voltage of P-channel transistors M5 and M6. Thus, when the prior art differential amplifier 10 is used in the "auto-zero" mode, nodes V1 and V2 are charged to the value of $V_{DD}-|V_{GS}|$. When switches S1 and S2 are opened, the input common-mode of amplifier 10, and thus the gate voltages of transistors M1 and M2, are also set at $V_{DD}-|V_{GS}|$. In addition, drain voltages of transistors M1 and M2 are below their gate voltage by an amount equal to the drain-source voltage of devices M3 and M4. To achieve the highest gain-bandwidth product (GBW) for differential amplifier 10, transistors M1 and M2 need to be biased to operate deep in their saturation region. Although saturation can be achieved by keeping the drain voltages of transistors M1 and M2 no lower than a predetermined threshold voltage below their gate voltages, generally, the farther away the drain voltage is set from this threshold limit, the better the gain-bandwidth of amplifier 10 will be. This is especially true when short-channel transistors are used for M1 and M2 (as is often the case for high speed applications), since for short-channel devices the boundary between the triode region of operation and the saturation region of operation is not clearly defined. For these devices a substantial improvement in the transconductance results if the drain voltage is kept further away from the gate voltage.

With the auto-zero technique described above, even in the best case, where cascoding devices M3 and M4 are removed, the drain voltages of transistors M1 and M2 can only equal their gate voltages. The addition of cascoding devices M3 and M4 moves the drain voltages of transistors M1 and M2 below their gate voltages, and further brings transistors M1 and M2 closer to leaving the saturation region. In addition, with the prior art differential amplifier, since the gates of transistors M1 and M2 are biased close to $V_{DD}$, the output voltage swing of the differential amplifier 10 is also limited.

SUMMARY OF THE INVENTION

The present invention overcomes the limitations of the prior art by reducing the supply voltage to the differential amplifier during the auto-zero mode.

In a first embodiment the present invention is achieved by a differential amplifier connected to a power source to receive an external power supply voltage, the differential amplifier including amplification means for amplifying a difference between two signals input thereto; and reduction means for selectively reducing the power supply voltage from a first level to a second level (an internal power supply voltage) during a first phase of operation of the differential amplifier and returning the power supply voltage to the first level during a second phase of operation of the differential amplifier.

In a preferred embodiment, the reduction means comprises a DC reference voltage.

DETAILED DESCRIPTION OF THE DRAWINGS

DETAILED DESCRIPTION OF THE PREFERRED EMBODIMENT

Figure 2:
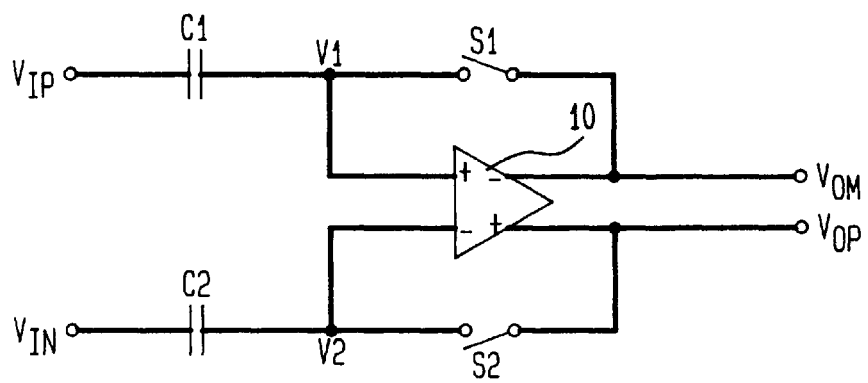
FIG. 2 is a block diagram of a differential amplifier configured for operation in an auto-zero mode.
Figure 3:
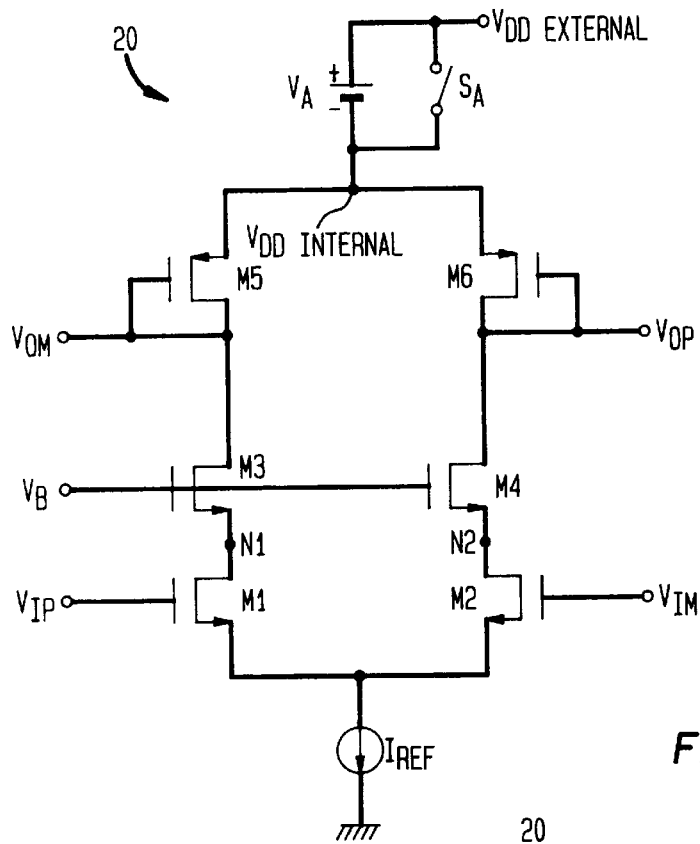
FIG. 3 is a circuit diagram of a differential amplifier according to the present invention.

FIG. 3 illustrates a differential amplifier 20 in accordance with the present invention. Assuming that the differential amplifier is configured as shown in FIG. 2 (with differential amplifier 20 replacing differential amplifier 10), during the auto-zero mode when switches S1 and S2 are closed, the output common-mode voltage of the differential amplifier 20 is changed by dropping the supply voltage thereto by a predetermined amount. This is symbolically shown by inserting a battery $V_A$ between the external supply voltage $V_{DD}$ and the sources of devices M5 and M6 as shown in FIG. 3. With this modification, during the auto-zero mode, the voltages at nodes V1 and V2 are equal to $V_{DD}-V_A-|V_{GS}|$, where $|V_{GS}|$ is the absolute value of the gate-source voltage of transistors M5 and M6.

Thus, by adjusting $V_A$, an optimal input common-mode voltage for the differential amplifier 20 can be selected. When switches S1 and S2 are opened, the auto-zero mode is terminated and the amplification mode begins. In the amplification mode, the battery voltage of battery $V_A$ is by-passed by closing switch SA. As a consequence, the voltage on nodes $V_{OP}$ and $V_{OM}$ is increased by an amount equal to the voltage of battery $V_A$ and the output common-mode voltage is re-established. Nodes N1 and N2, which are the drain nodes of transistors M1 and M2, are also moved away from their gate voltages by an amount equal to or less than the voltage of battery $V_A$, thereby biasing transistors M1 and M2 into deep saturation. During the auto-zero mode, the bias voltage $V_B$ can either be reduced by an amount equal to the voltage of battery $V_A$ or left unchanged. If left unchanged, the operating voltages of M3 will be different during the auto-zero mode and the amplification mode. This does effect the accuracy of the acquired offset voltage during the auto-zero mode because of different DC gains in the two modes; however, the inaccuracy in the acquired offset is small enough to be negligible.

Figure 1:
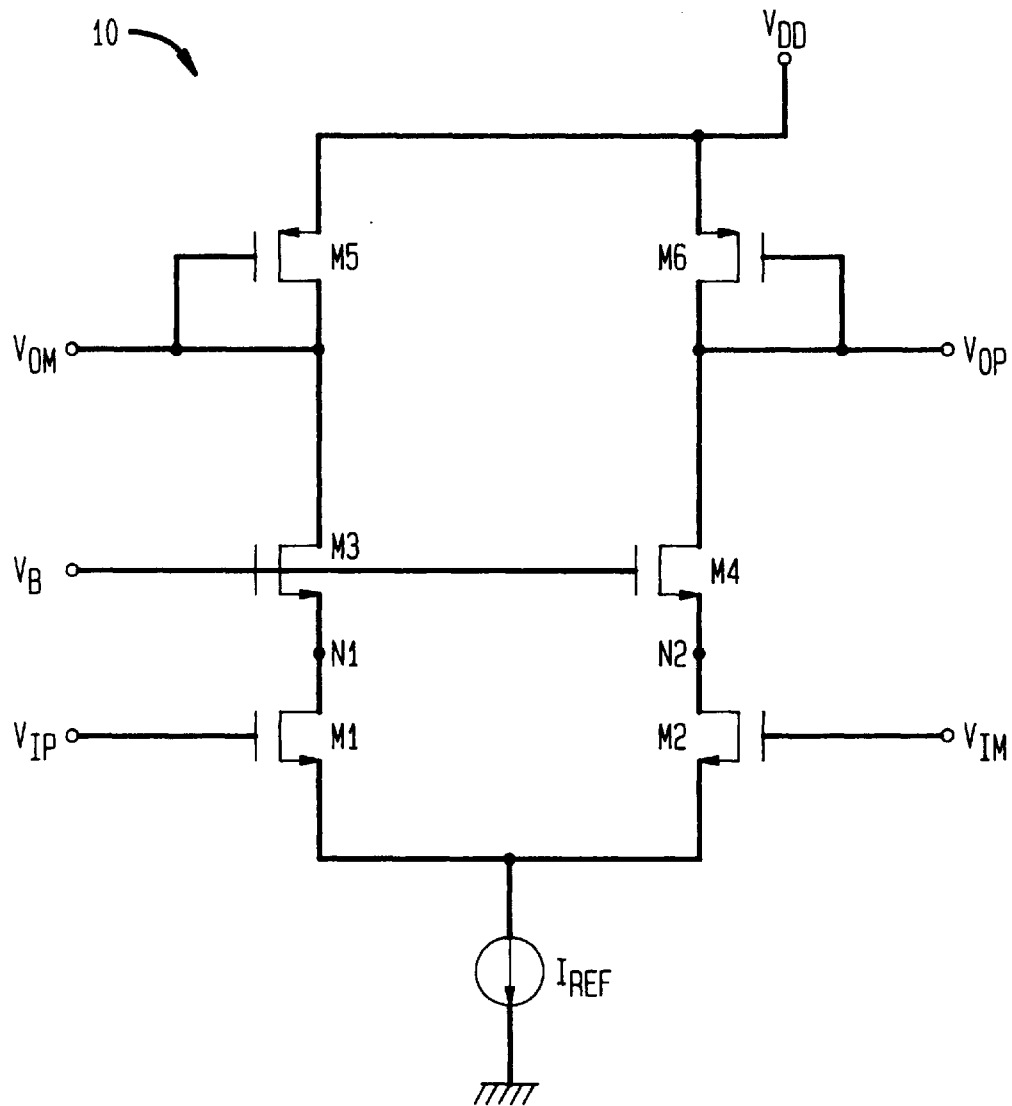
FIG. 1 is a circuit diagram of a prior art differential amplifier.

Compared to the prior art differential amplifier of FIG. 1, several distinct performance advantages result from the differential amplifier of the present invention. In the prior art amplifier, the input common-mode voltage is fixed at $V_{DD}-|V_{GS}|$, and is very close to the power supply voltage $V_{DD}$. With the differential amplifier 20 of the present invention, the input common-mode voltage can be chosen to be any value such that $(|V_{GS1}|+V_{ON}) < V_{ICM} < (V_{DD}-|V_{GS5}|)$ where $|V_{GS1}|$ is the absolute value of the gate-source voltage of transistor M1, $V_{ON}$ is the minimum compliance voltage of $I_{REF}$, and $|V_{GS5}|$ is the absolute value of the gate to source voltage of transistor M5. This allows for the proper utilization of the available supply voltage.

A second advantage is that in the amplification mode, the drain voltages of transistors M1 and M2 are moved further away from their gate voltages compared to the value that they would be when the prior art differential amplifier 10 is used. If no cascoding devices (M3, M4) are used, then the shift in the drain voltages of transistors M1 and M2 (going from auto-zero mode to amplification mode) is equal to the voltage of battery $V_A$; if cascading devices (M3, M4) are in place, then the shift is either $V_A$ or less (depending on what happens to $V_B$), but still improved over the prior art. In either case, because of this shift, an improvement of the GBW of the amplifier results.

A third improvement is in the negative output-voltage swing. In the absence of the cascading devices M3 and M4 an improvement equal to the voltage of battery $V_A$ in the negative output-swing over the prior art results. In the presence of cascoding devices M3 and M4, the improvement depends upon the biasing of these two devices.

Figure 4:
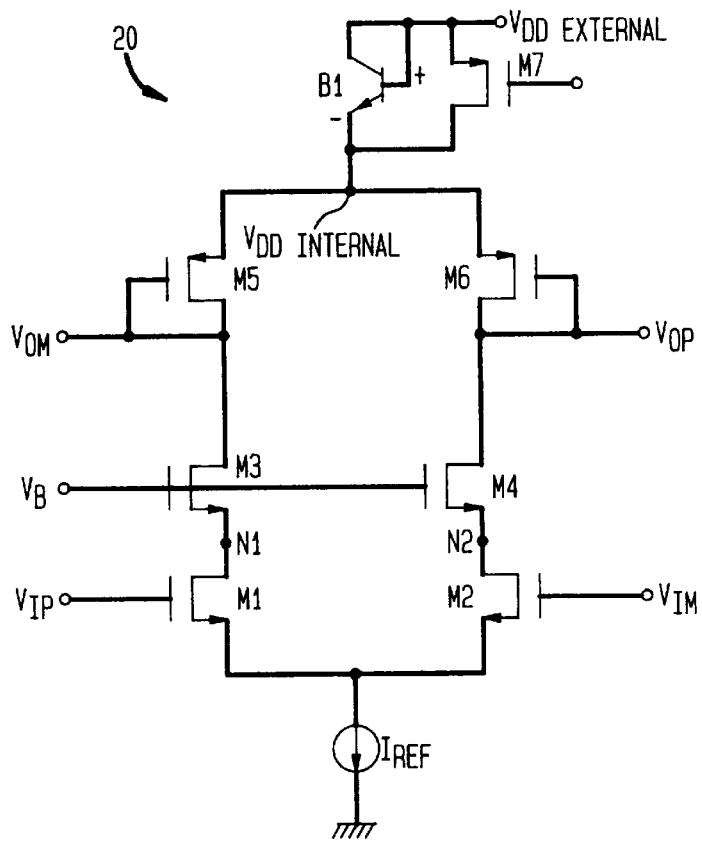
FIG. 4 is circuit diagram of a differential amplifier of the present invention showing a first embodiment of a voltage drop device to accomplish the adjustable input common mode.
Figure 5:
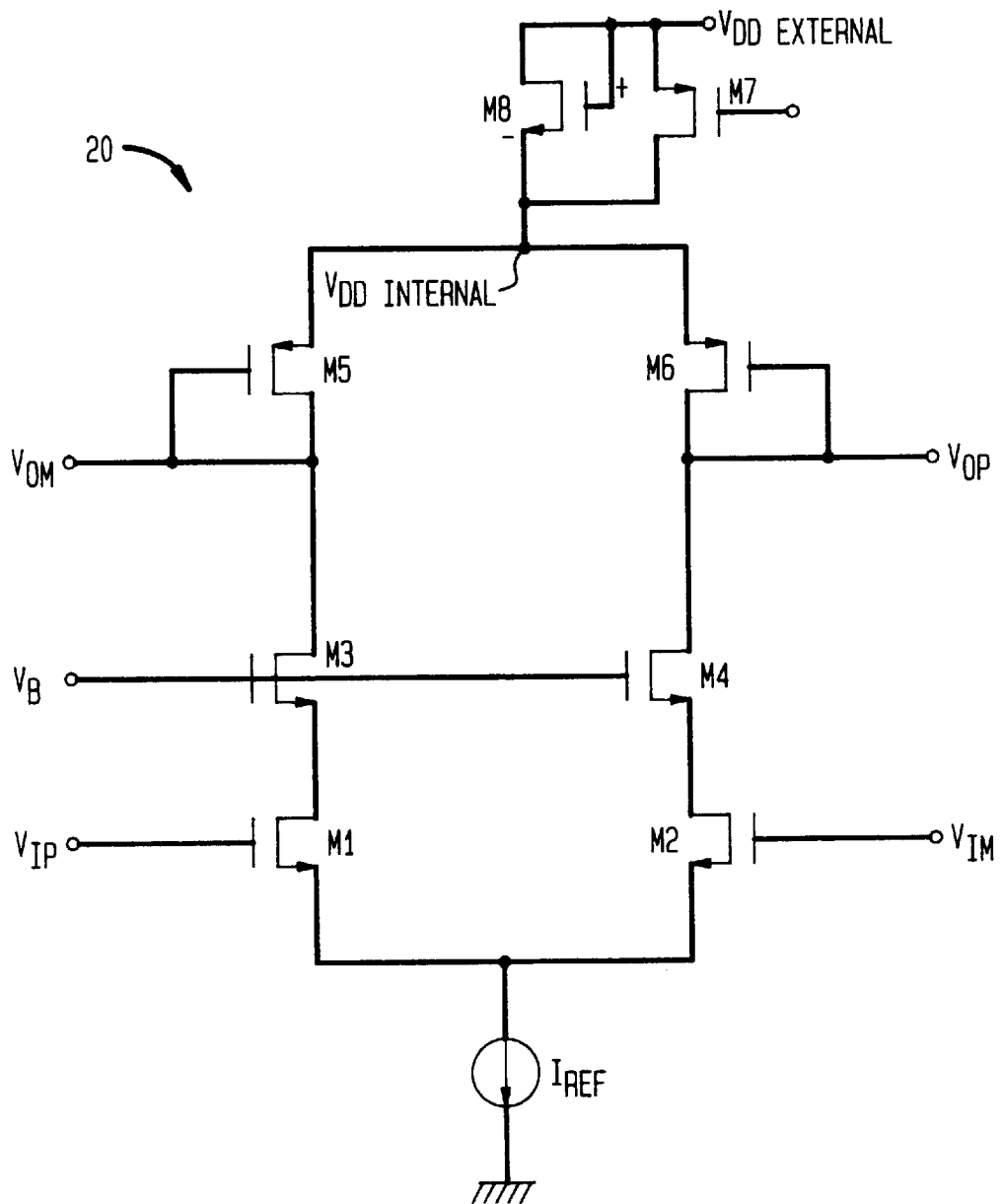
FIG. 5 is circuit diagram of a differential amplifier of the present invention showing a second embodiment of a voltage drop device to accomplish the adjustable input common mode.

Although the invention is disclosed with reference to the amplifier circuit of FIG. 3, this invention is not limited to this circuit. For example, as is widely known, one could replace switches M5 and M6 by resistors and change the resistor values to obtain the desired output common-mode voltage, and still make use of the technique described above. Further, although $V_A$ is shown symbolically in FIG. 3 as a battery, $V_A$ can comprise any conventional voltage-drop device. For example, as shown in FIG. 4, one particular implementation could use an NPN bipolar transistor B1 with its base and collector tied together to replace $V_A$, and an MOS transistor M7 could be used to replace switch SA. The gate of MOS transistor M7 is connected to a digital control line that is "high" when in the auto-zero mode and "low" in the amplification mode. In this arrangement, when transistor M7 is off, node $V_{DD\ INTERNAL}$ is approximately a diode drop (0.7 volts) below $V_{DD\ EXTERNAL}$, and when M7 is on, node $V_{DD\ INTERNAL}$ is very close to the power supply voltage $V_{DD\ EXTERNAL}$. Similarly, as shown in FIG. 5, an MOS device M8 can be connected with its gate and drain connected together, to achieve a similar result. If better accuracy for $V_A$ is desired, one can chose to use more stable voltage references derived from the bandgap voltage reference circuits.

One example of the use of the differential amplifier of the present invention would be in a fully differential comparator circuit commonly used in high-speed analog to digital (A/D) converters. Such comparators are used for comparing the difference in levels (e.g., voltages) of a pair of input electrical signals. Typically, a differential comparator consists of two circuit blocks: a differential amplifier that amplifies the difference between a reference signal and an input signal; and a sense amp/latch that senses the amplified difference between the reference signal and the input signal and converts that difference into a digital 1 or 0, based on whether the amplified signal is positive or negative.

In such comparators, both the offset of the amplifier and a reference level are acquired during the auto-zero mode in a well known manner. When the amplifier is in the amplification mode, it amplifies the offset-free difference between the acquired reference voltage and the input signal. Superior speed performance in the comparator results if the GBW of the amplifier is higher. Using a differential amplifier of the present invention, instead of the prior art differential amplifier, results in a faster comparator and in turn, faster high speed A/D converters.

While there has been described herein the principles of the invention, it is to be understood by those skilled in the art that this description is made only by way of example and not as a limitation to the scope of the invention. Accordingly, it is intended by the appending claims, to cover all modifications of the invention which fall within the true spirit and scope of the invention.

We claim:

1. A method for adjusting the input common-mode voltage of a differential amplifier receiving a power supply voltage from a power supply, comprising the steps of:
   reducing the power supply voltage from a first level to a second level during a first phase of operation; and
   returning the power supply voltage to said first level during a second phase of operation.

2. A method as set forth in claim 1, wherein said first phase of operation is an offset acquisition phase and said second phase of operation is an amplification phase.

3. A method as set forth in claim 2, wherein said step of reducing the power supply voltage comprises selectively connecting a voltage drop device in series between said power supply and said differential amplifier.

4. A method as set forth in claim 3, wherein said voltage drop device comprises a bipolar transistor.

5. A method as set forth in claim 3, wherein said voltage drop device comprises an MOS device.

6. A method for adjusting the input common-mode voltage of a differential amplifier, said differential amplifier being supplied with a external power supply voltage of a first value, said method comprising the steps of:

reducing the external power supply voltage to an internal power supply voltage of a second value during a first phase of operation; and returning said external power supply voltage to said first value during a second phase of operation.

7. A method as set forth in claim 6, wherein said first phase of operation comprises acquiring the offset and input common-mode of said differential amplifier.

8. A method as set forth in claim 7, wherein said second phase of operation comprises an amplification phase of said differential amplifier.

9. In an integrated circuit, a differential amplifier coupled to a power source to receive a power supply voltage, said differential amplifier comprising:

amplification means for amplifying a difference between two signals input thereto; and reduction means for selectively reducing the power supply voltage from a first level to a second level during a first phase of operation of said differential amplifier and returning the power supply voltage to said first level during a second phase of operation of said differential amplifier to adjust an input common-mode voltage of said differential amplifier.

10. An integratal circuit as set forth in claim 9, wherein said first phase of operation is an offset acquisition phase and said second phase of operation is an amplification phase.

11. An integratal circuit as set forth in claim 9, wherein said reduction means comprises a voltage drop device selectively connectable in series between said power supply and said amplification means.

12. An integratal circuit as set forth in claim 11, wherein said voltage drop device comprises a bipolar transistor.

13. An integratal circuit as set forth in claim 11, wherein said voltage drop device comprises an MOS device.

14. A differential amplifier coupled to a power source to receive a power supply voltage, comprising:

an amplifier; and a voltage drop device selectively connectable between said amplifier and said power supply for reducing the power supply voltage from a first level to a second level during a first phase of operation of said differential amplifier and returning the power supply voltage to said first level during a second phase of operation of said differential amplifier to adjust an input common-mode voltage of said differential amplifier.

15. A differential amplifier as set forth in claim 14, wherein said voltage drop device comprises a biopolar transistor.

16. A differential amplifier as set forth in claim 14, wherein said voltage drop device comprises an MOS device.

* * * * *